(12) United States Patent
Chen

(10) Patent No.: US 10,024,530 B2
(45) Date of Patent: Jul. 17, 2018

(54) LIGHTING DEVICE AND LED LUMINAIRE

(71) Applicant: SANSI TECHNOLOGY, INC., Ontario (CA)

(72) Inventor: Ming Chen, Vancouver (CA)

(73) Assignee: SANSI LED LIGHTING INC., Union City, CA (US)

( * ) Notice: Subject to any disclaimer, the term of this patent is extended or adjusted under 35 U.S.C. 154(b) by 331 days.

(21) Appl. No.: 14/323,014

(22) Filed: Jul. 3, 2014

(65) Prior Publication Data

US 2016/0003419 A1   Jan. 7, 2016

(51) Int. Cl.

| | |
|---|---|
| *F21V 9/16* | (2006.01) |
| *F21V 29/71* | (2015.01) |
| *F21V 5/04* | (2006.01) |
| *F21V 29/83* | (2015.01) |
| *H01L 25/075* | (2006.01) |
| *H01L 33/64* | (2010.01) |
| *F21K 9/232* | (2016.01) |
| *F21S 8/00* | (2006.01) |
| *H01L 33/50* | (2010.01) |
| *H01L 33/54* | (2010.01) |
| *H01L 33/62* | (2010.01) |

(Continued)

(52) U.S. Cl.
CPC ............ *F21V 29/83* (2015.01); *F21K 9/232* (2016.08); *H01L 25/0753* (2013.01); *H01L 33/641* (2013.01); *H01L 33/647* (2013.01); F21S 8/00 (2013.01); F21V 23/007 (2013.01); F21V 29/70 (2015.01); F21V 29/773 (2015.01); F21Y 2105/10 (2016.08); F21Y 2105/12 (2016.08); F21Y 2113/00 (2013.01); F21Y 2113/13 (2016.08); F21Y 2115/10 (2016.08); H01L 33/50 (2013.01); H01L 33/54 (2013.01); H01L 33/62 (2013.01); H01L 33/642 (2013.01); H01L 2224/4824 (2013.01); H01L 2224/48091 (2013.01); H01L 2224/73265 (2013.01); H01L 2924/181 (2013.01)

(58) Field of Classification Search
None
See application file for complete search history.

(56) References Cited

U.S. PATENT DOCUMENTS 5,766,740 A * 6/1998 Olson ................. H01L 23/3735
174/138 G
6,498,355 B1   12/2002 Harrah et al.
(Continued)

FOREIGN PATENT DOCUMENTS

CN   101859857 A    10/2010
CN   201611667 U  * 10/2010
(Continued)

OTHER PUBLICATIONS

International Search Report dated Nov. 10, 2015 in International Application No. PCT/US2015/039046, filed Jul. 2, 2015.

(Continued)

*Primary Examiner* — Robert Carpenter
(74) *Attorney, Agent, or Firm* — Hauptman Ham, LLP

(57) ABSTRACT

A lighting device includes a base, at least one light emitting chip, at least one optical member covering the light emitting chip, and a thermally conductive adhesive layer. The thermally conductive adhesive layer has opposite sides directly contacting the light emitting chip and the base, respectively.

18 Claims, 20 Drawing Sheets

(51) Int. Cl.
*F21V 29/77* (2015.01)
*F21V 23/00* (2015.01)
*F21Y 113/00* (2016.01)
*F21V 29/70* (2015.01)
*F21Y 105/12* (2016.01)
*F21Y 105/10* (2016.01)
*F21Y 115/10* (2016.01)
*F21Y 113/13* (2016.01)

(56) References Cited

U.S. PATENT DOCUMENTS

| | | | |
|---|---|---|---|
| 7,507,004 B2* | 3/2009 | Chen | F21V 15/01 |
| | | | 362/245 |
| 7,670,872 B2* | 3/2010 | Yan | H01L 33/486 |
| | | | 257/E23.001 |
| 8,274,241 B2* | 9/2012 | Guest | F21K 9/135 |
| | | | 313/46 |
| 2008/0093620 A1 | 4/2008 | Lee et al. | |
| 2010/0096662 A1 | 4/2010 | Lin et al. | |
| 2011/0001148 A1 | 1/2011 | Sun et al. | |
| 2011/0310600 A1* | 12/2011 | Lehman | F21K 9/90 |
| | | | 362/217.14 |
| 2012/0015462 A1 | 1/2012 | Lai et al. | |
| 2012/0049204 A1 | 3/2012 | Lai | |
| 2012/0132952 A1 | 5/2012 | Yen | |

FOREIGN PATENT DOCUMENTS

| | | |
|---|---|---|
| CN | 102130084 A | 7/2011 |
| CN | 102569602 A | 7/2012 |
| EP | 2579344 A1 | 4/2013 |

OTHER PUBLICATIONS

Written Opinion dated Nov. 10, 2015 in International Application No. PCT/US2015/039046, filed Jul. 2, 2015.
Chinese Office Action dated Jun. 5, 2017 for Application No. 201590000788.4, 4 pages.

* cited by examiner

LIGHTING DEVICE AND LED LUMINAIRE

TECHNICAL FIELD

The disclosure is generally related to lighting devices, and more particularly to LED luminant devices and LED luminaries.

BACKGROUND

In recent years, there has been increased interest and popularity in LED luminaires which use light emitting diodes ("LEDs") as a light source. These LED luminaires become more and more attractive since they overcome many of the disadvantages of the light sources known to the inventor, which include incandescent light bulbs, fluorescent tubes, and halogen lamps.

With the development of semiconductor lighting devices, LED lighting sources including LED chips are in great popularity in lighting luminaires used in both consumer and industrial markets. The inventor(s) has recognized that the LED lighting sources generate considerable heat. Excess heat can result in failure of the operating components of the lighting luminaires. The inventor(s) has also recognized that, in various LED lighting luminaires, including recessed lighting luminaires, all of the components are integrated into the luminaire so if one component goes bad, it is difficult to replace the failed component and it is often necessary to replace the entire recessed lighting luminaire.

Referring to FIG. 1, China Patent No.: 201210006965.2 discloses an LED lighting module including a packaged unit 11, a light emitting chip 12, a light support 13, a circuit board 14 and a heat sink 15, wherein the combination of the packaged unit 11, the light emitting chip 12 and the light support 13 is referred to as an LED component. The LED component is not usable independently because it is not equipped with the capacity of electricity and heat dissipation. The LED component is connected to the circuit board 14 and adhered on the heat sink 15 with thermally conductive material. Heat produced form the light emitting chip in the LED lighting module will dissipate with a large thermal resistance through the chip, the light support, the circuit base, the thermally conductive material and the heat sink.

The inventor(s) has further recognized that various high power LED luminaires are assembled by multiple parts including LED lighting devices, aluminum substrates, heat sinks, bonding members, and seal enclosures. Different LED luminaires are assembled with different parts which are often not standardized for mass production. Without standardized components and/or mass production, the manufacturing cost remains a concern for the industry of LED luminaires.

SUMMARY

According to one aspect of the disclosed embodiments, a lighting device includes a base, at least one light emitting chip, at least one optical member covering the light emitting chip, and a thermally conductive adhesive layer. The thermally conductive adhesive layer has opposite sides directly, which contact the light emitting chip and the base, respectively.

According to a further aspect of the disclosed embodiments, a LED luminaire includes a plurality of LED components. Each LED component includes a base, a thermally conductive adhesive layer coated on the top surface of the base, a LED chip disposed on the thermally conductive adhesive layer, an optical member covering the LED chip, and a frame. The frame defines a plurality of cavities for accommodating the corresponding LED components.

According to another aspect of the disclosed embodiments, a lighting device includes a base, a thermally conductive adhesive layer coated on the top surface of the base, a light emitting chip disposed on the thermally conductive adhesive layer, and an optical member covering the light emitting chip. The lighting device is free of a circuit board between the base and the light emitting chip.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
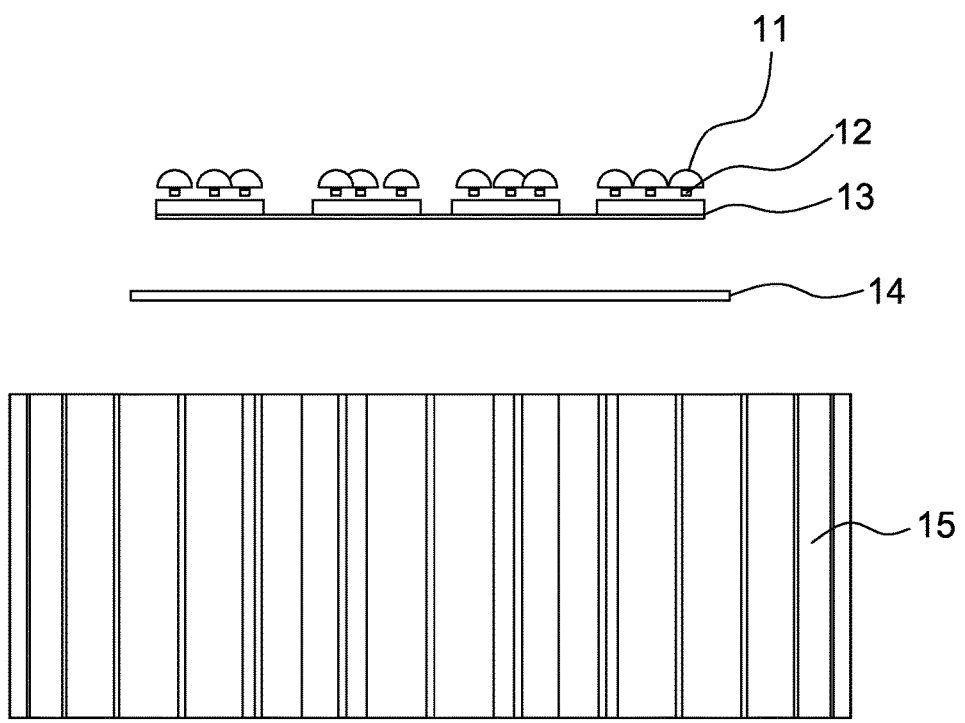
FIG. 1 is a schematic diagram of a LED lighting module known to the inventor.

It is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and not regarded as limiting. The use of "including," "comprising," or "having" and variations thereof herein is meant to encompass the items listed thereafter and equivalents thereof as well as additional items. Unless limited otherwise, the terms "connected," "coupled," and variations thereof herein are used broadly and encompass direct and indirect connections, couplings, and mountings. In addition, the terms "connected" and "coupled" and variations thereof are not restricted to physical or mechanical connections or couplings.

Furthermore, and as described in subsequent paragraphs, the specific mechanical configurations illustrated in the drawings are intended to exemplify embodiments of the disclosure and that other alternative mechanical configurations are possible.

Figure 2:
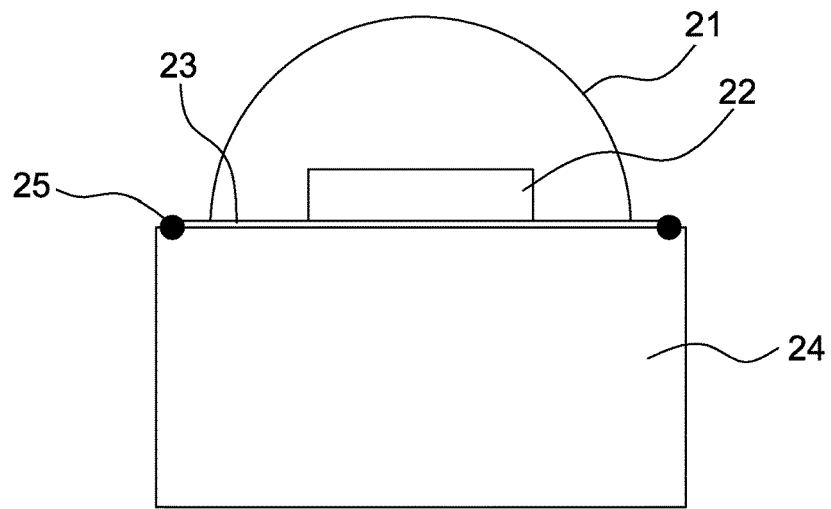
FIG. 2 is a schematic diagram of the LED lighting device in accordance with the first embodiment of the present disclosure.
Figure 3:
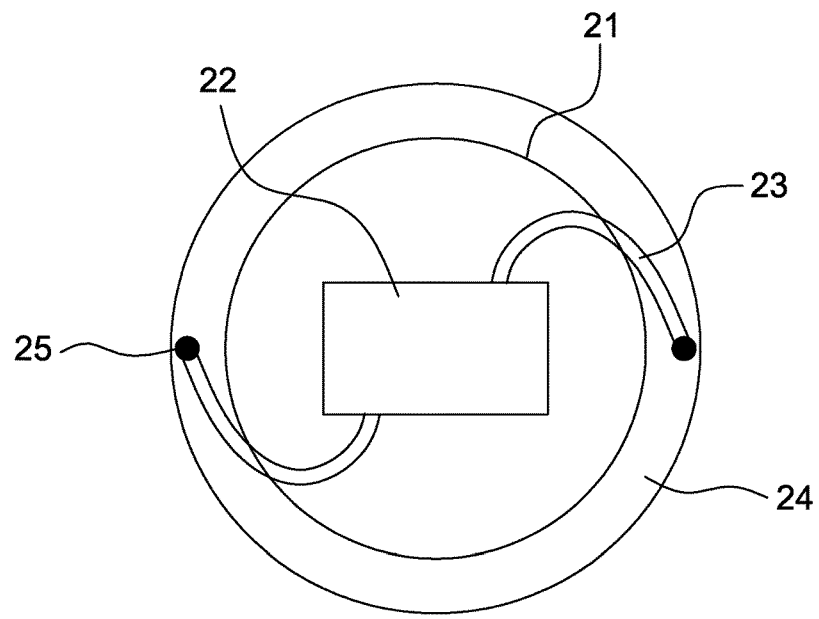
FIG. 3 is a top perspective view of the LED lighting device without optical lens shown in FIG. 2.

Referring to FIGS. 2 and 3, an LED lighting device according to the first embodiment of the disclosure includes an optical lens 21, a light emitting chip 22, a thermally conductive layer 23 and a base 24. The optical lens 21 is disposed on the light emitting chip 22 not only for waterproof and dustproof but also for adjusting the lighting efficacy for the LED lighting device. The thermally conductive layer 23 is a thin layer of thermally conductive and electrical conductive material coated on the top surface of the base 24 for coupling the light emitting chip 22 to the base 24. Slots are provided at both sides of the optical lens 21 for accommodating the thermally conductive layer 23 according to the circuit layout thereof. Each wire of the thermally conductive layer 23 includes two bonding pads 25 on the both ends thereof, and the layout of each wire is designed according to the electrical needs for the light emitting chip 22. The LED lighting device includes only one light emitting chip 22 covered with an optical lens 21, and the base 24 is a heat sink made of ceramic material having good heat dissipation effect and electrical insulation. According to the LED lighting device of the invention, there is no need to dispose a light support between the base 24 and light emitting chip 22 to carry the light emitting chip 22 in comparison with the luminous module of FIG. 1 that is required to include a light support 13 to carry the light emitting chip 12.

Figure 4:
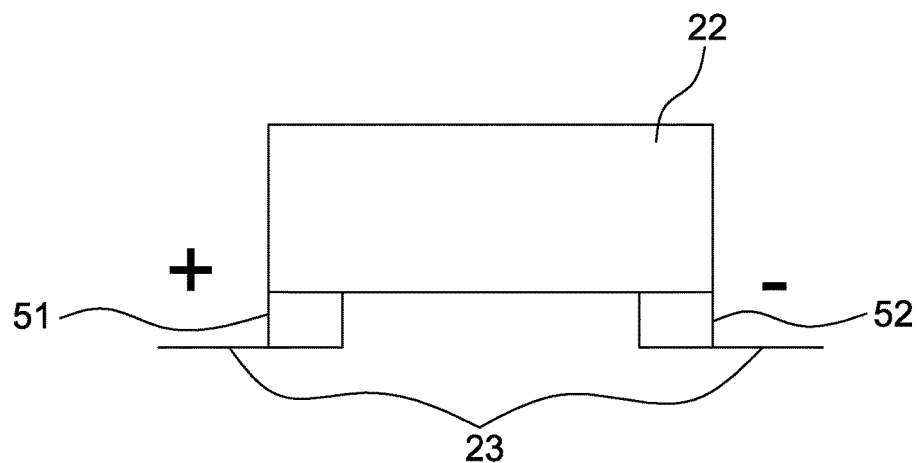
FIG. 4 is a schematic diagram of the light emitting chip included in the LED lighting device shown in FIG. 2.

Referring to FIG. 4, it shows the LED lighting chip 22 in FIGS. 2 and 3. The LED lighting chip 22 has an anode pin 51 and a cathode pin 52 on its bottom and the anode pin 51 and the cathode pin 52 are soldered onto to the wire of the thermally conductive layer 23. Preferably, the thermally conductive layer 23 is made of a layer of solder with good thermal and electrical conductivity for coupling the LED lighting chip 22 onto the base 24. In another embodiment, the thermally conductive layer 23 may be conductive silver paste. In still another embodiment, the thermally conductive layer 23 may be made from one of the metals selected from the group consisting of molybdenum, manganese, wolframium, argentum, aurum, platinum, silver palladium alloy, cuprum, aluminum and stannum.

Figure 5:
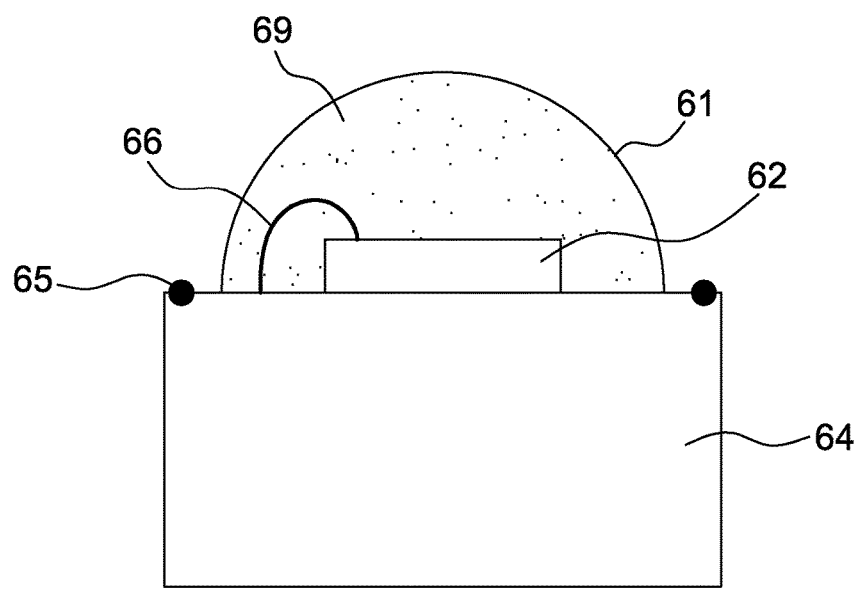
FIG. 5 is a schematic diagram of a LED lighting device in accordance with the second embodiment of the present disclosure.
Figure 6:
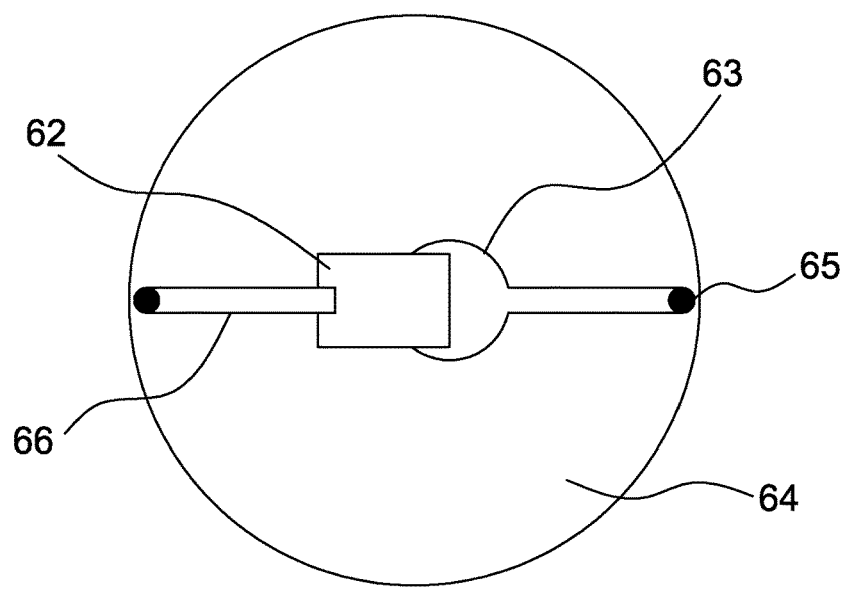
FIG. 6 is a top perspective view of the LED lighting device without packaging adhesive shown in FIG. 5.

Referring to FIGS. 5 and 6, an LED lighting device according to the second embodiment of the disclosure comprises a packaging adhesive 61, a light emitting chip 62, thermal coupling material and a base 64. The thermal coupling material is a thin layer of metal circuit 63 which is coated on the surface of the base 64 and the light emitting chip 62 is disposed on the thermal coupling material. The metal circuit 63 is made from one of the metals comprising of molybdenum, manganese, wolframium, argentum, aurum, platinum, silver palladium alloy, cuprum, aluminum and stannum. The light emitting chip 62 is covered by a packaging adhesive 61 to achieve the waterproof and sealing effect. An anode 67 on the upper surface of the light emitting chip 62 is bonding to a pad 65 by a leading wire 66, and a cathode 68 on the lower surface id light emitting chip 62 is coupling to the metal circuit layer 63 to further bonding to another pad 65. A phosphor 69 is filled within the packaging adhesive 61 to change the spectrum of the light from the light emitting chip 62. The base 64 is made of thermal plastic with electrical insulation. The metal circuit layer 63 is preferably made of a coating of conductive silver paste with good thermal conductivity, electrical conductivity and viscosity to adhere the light emitting chip 62 to the base 64.

Figure 7:
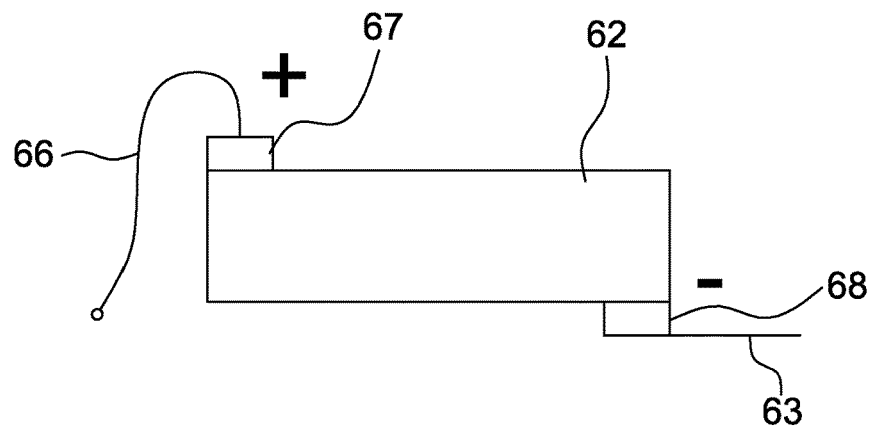
FIG. 7 is a schematic diagram of the light emitting chip included in the LED lighting device shown in FIG. 5.

Referring to FIG. 7, it shows the light emitting chip 62 in FIGS. 5 and 6. The light emitting chip 62 has an anode pin 67 on its upper surface and a cathode pin 68 on its bottom surface. The anode pin 51 is bonding to the pad 65 by the leading wire 66 and the cathode pin 52 is soldered onto to the wire of the metal circuit layer 63.

Figure 8:
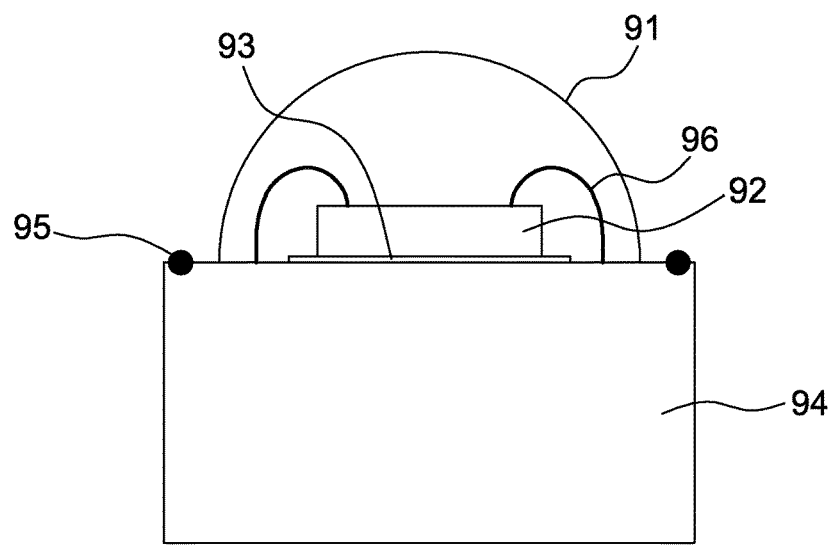
FIG. 8 is a schematic diagram of a LED lighting device in accordance with the third embodiment of the present disclosure.
Figure 9:
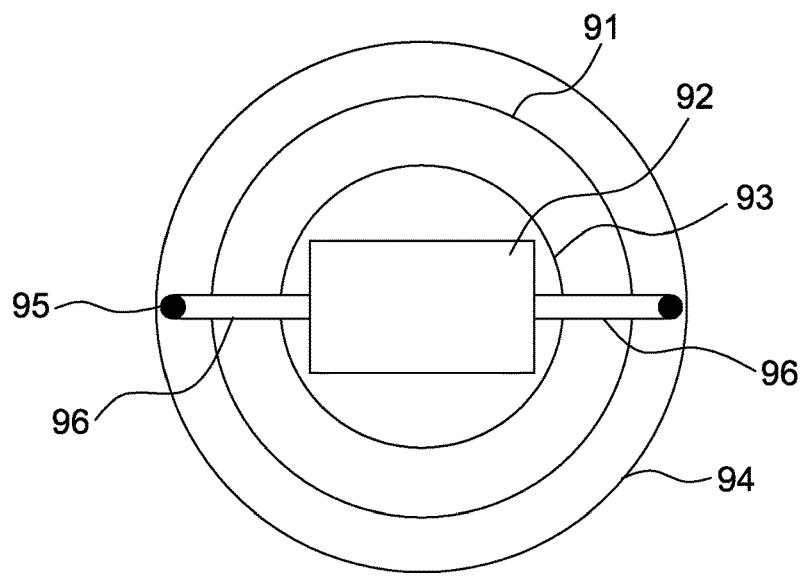
FIG. 9 is a top perspective view of the LED lighting device without optical shield shown in FIG. 8.
Figure 10:
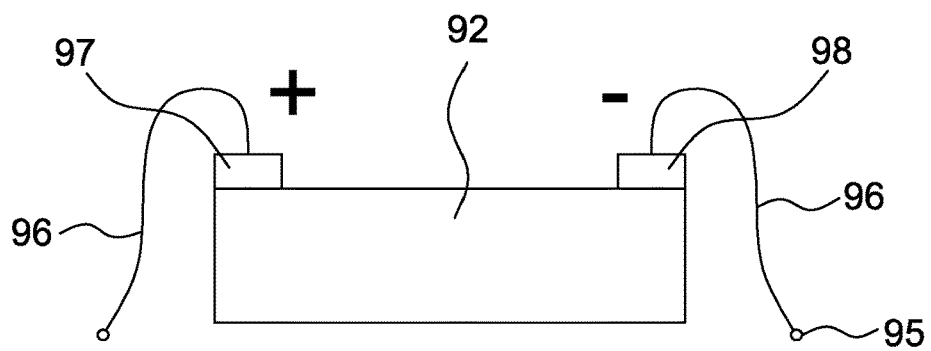
FIG. 10 is a schematic diagram of the light emitting chip included in the LED lighting device shown in FIG. 8.

Referring to FIGS. 8, 9 and 10, an LED lighting device according to the third embodiment of the disclosure comprises an optical shield 91, a light emitting chip 92, a heat-conducting film 93 and a base 94. The heat-conducting film 93 is coated on the surface of the base 94 and couples with the lower surface of the light emitting chip 92. The light emitting chip 92 is covered by an optical shield 91 to achieve the waterproof and sealing effect. An anode 97 and a cathode 98 on the upper surface of the light emitting chip 92 are bonding to the pads 95 disposed on the heat-conducting film 93 by leading wires 96 extending out the optical shield 91 to implement the circuit connection. Specifically, the base 94 is a lighting cylinder and the heat-conducting film 93 is an insulator to electricity. The heat-conducting film 93 is preferably made of a diamond film which is an insulator to electricity but with good thermal conductivity to transfer heat efficiently from the light emitting chip 91 to the base 94. The metal circuit layer and pads 95 are disposed on the heat-conducting film 93 to implement the circuit connection between the light emitting chip 92 and the power supply.

Figure 11:
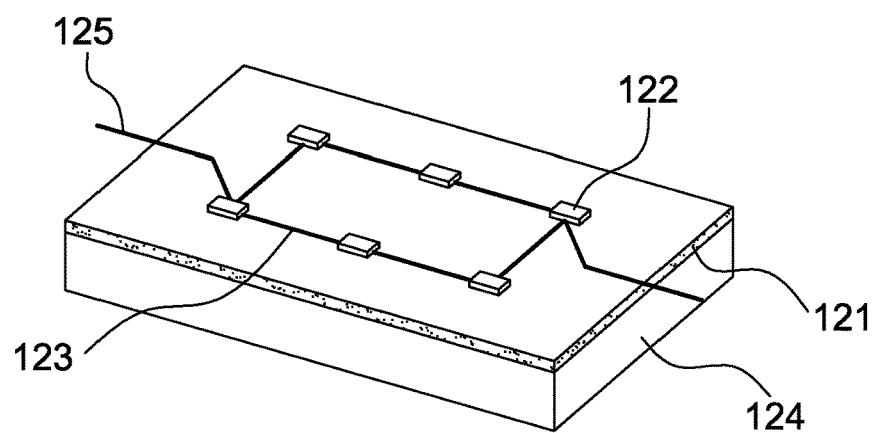
FIG. 11 is a schematic diagram of an LED lighting device in accordance with the fourth embodiment of the present disclosure.

Referring to FIG. 11, an LED lighting device according to the fourth embodiment of the disclosure comprises six light emitting chips 122, a thermal coupling layer 123 and a base 124. The six light emitting chips 122 with three different colors are arranged in a 2×3 matrix. The thermal coupling layer 123 including a thin layer of metal circuit is coated on the surface of base 124 for coupling the light emitting chips 122 to the base 124 and for electrically connecting through the layer of metal circuit to two leading wires 125 which are further connected to a power source. An optical sealing film 121 covers all light emitting chips 122 and the metal circuit with the two leading wires 125 extending out for being connected to a power source. The base 124 is made of a ceramic insulated material and the heat produced by light emitting chips 122 is transferred through the thermal coupling layer and the ceramic base 124 to the surrounding environment. Optical materials are disposed on all light emitting chips 122 to change the light spectrum of the light emitting chips 122.

Figure 12:
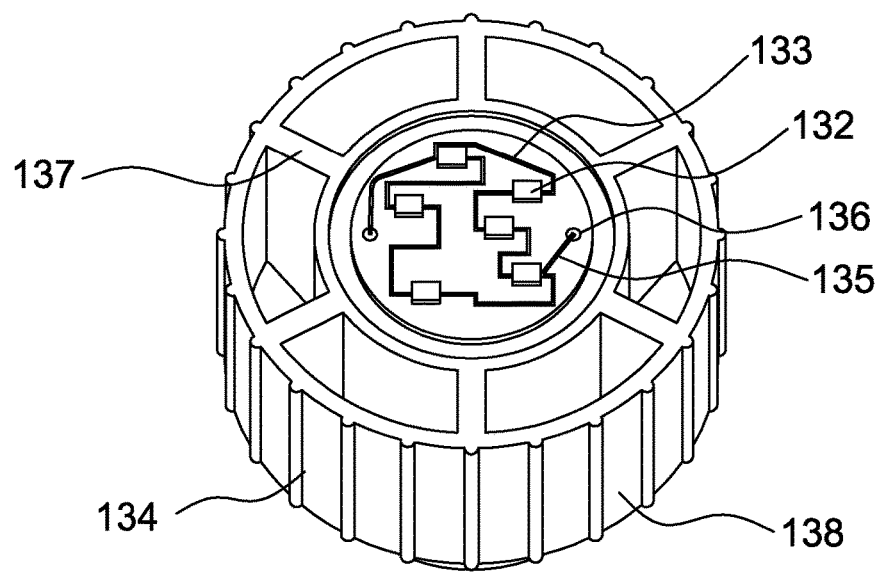
FIG. 12 is a schematic diagram of an LED lighting device in accordance with the fifth embodiment of the present disclosure.
Figure 13:
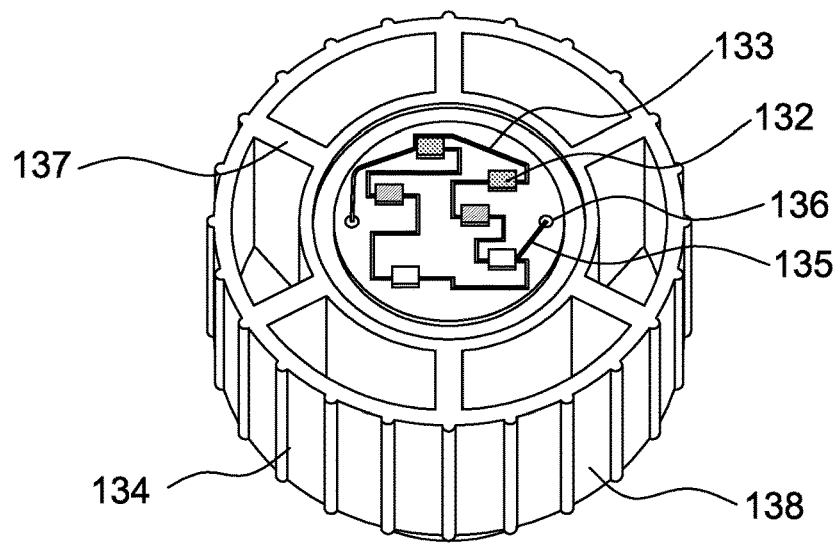
FIG. 13 is a schematic diagram of an LED lighting device in accordance with the sixth embodiment of the present disclosure.
Figure 14:
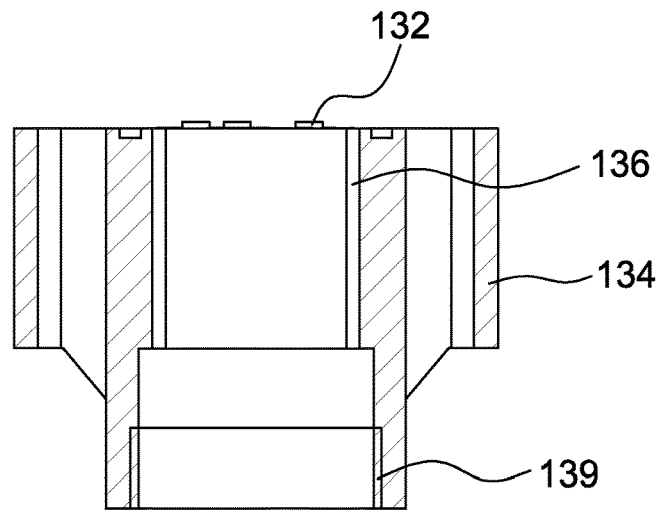
FIG. 14 is a longitudinal sectional view of the LED lighting device shown in FIG. 12.
Figure 15:
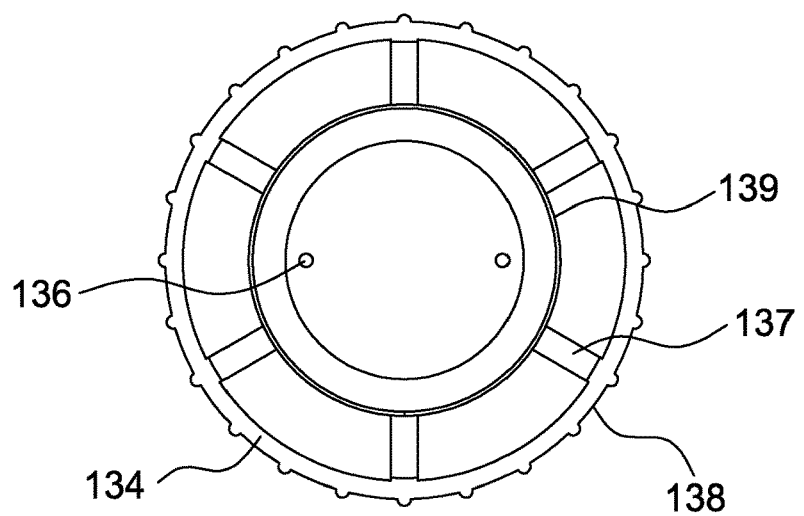
FIG. 15 is a bottom perspective view of the LED lighting device in FIG. 12.

Referring to FIGS. 12, 14 and 15 an LED lighting device according to the fifth embodiment of the disclosure comprises a plurality of light emitting chips 132, a metal circuit layer 133 and a base 134. The light emitting chips 132 are of the same color as shown in FIG. 12 or different color as shown in FIG. 13. The metal circuit layer 133 is coated on the surface of the base 134 for electrically connecting the light emitting chips 132 to the leading wires 135 which are connected to a power source. The base 134 is an insulated hollow member provided with auxiliary heat dissipation structures. The auxiliary heat dissipation structures include a plurality of heat dissipation ribs 137 radially extending outwardly from the base 134 and a ring structure with heat dissipation grooves 138 surrounding the heat dissipation ribs 137 to form a honeycombed structure. There are two through-holes 136 disposed in the base 134 and the leading wires 135 extend through these through-holes 136 to be connected to a power source. A screw thread portion 139 is provided inside the bottom portion of the base 134 for coupling the base 134 to a power supply device.

Referring to FIG. 13, it shows an LED lighting device according to the sixth embodiment of the disclosure similar to the fifth embodiment shown in FIG. 12. The only difference is that the light emitting chips 132 are of different color as shown in FIG. 12.

Figure 16:
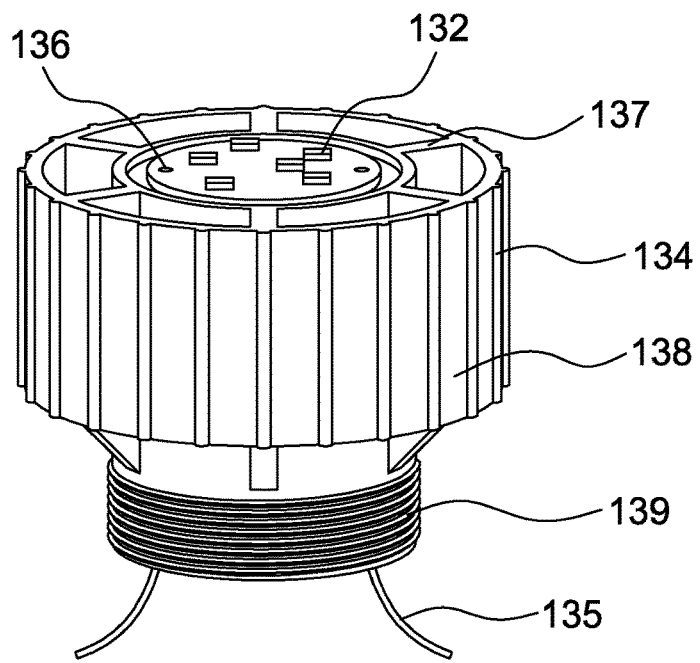
FIG. 16 is a schematic diagram of a LED lighting device i in accordance with the seventh embodiment of the present disclosure.

Referring to FIG. 16, it shows an LED lighting device according to the seventh embodiment of the disclosure similar to the fifth embodiment shown in FIG. 12 Specifically, the screw thread portion 139 is disposed outside the bottom portion of the base 134.

Figure 17:
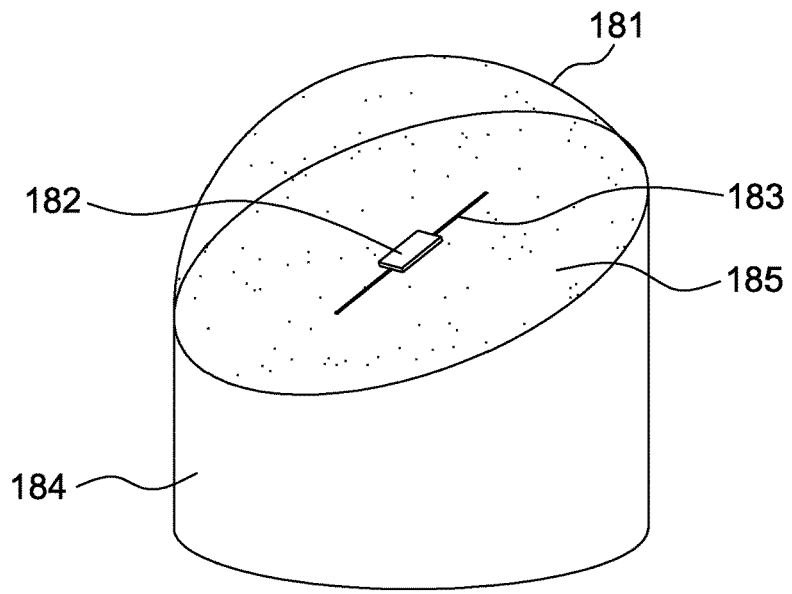
FIG. 17 is a schematic diagram of a LED lighting device in accordance with the eighth embodiment of the present disclosure.

Referring to FIG. 17, an LED lighting device according to the eighth embodiment of the disclosure comprises an optical lens 181, a light emitting chip 182 enclosed within the optical lens 181, a metal circuit layer 183 and a base 184. The metal circuit layer 183 is disposed on the base 184 which is an insulated irregular pier made of insulated plastic material with thermal conductivity. A phosphor 185 is filled within the optical lens 181 to change spectrum of the light emitting chips 182.

Figure 18:
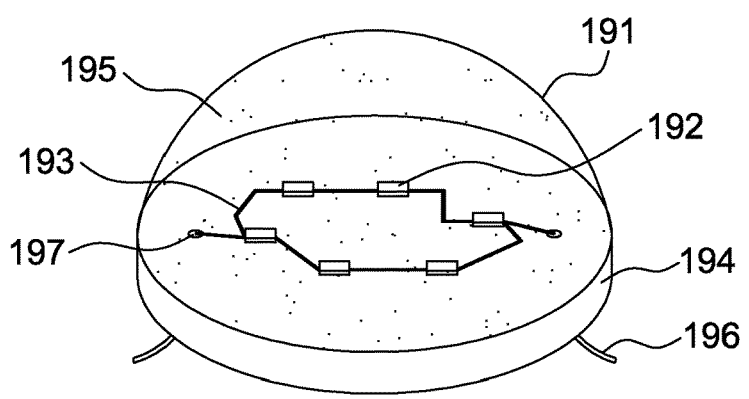
FIG. 18 is a schematic diagram of a LED lighting device in accordance with the ninth embodiment of the present disclosure.

Referring to FIG. 18, it shows an LED lighting device according to the ninth embodiment of the disclosure. The LED lighting device comprises a plurality of light emitting chips 192 of different colors disposed on the base 194, and an optical lens 191 totally convers the light emitting chips 192 and the upper surface of the base 194. A phosphor 195 is filled within the optical lens 191 to change spectrum of the light emitting chips 192. The light emitting chips 192 are coupled onto the surface of base 194 by a metal circuit layer 193, and the metal circuit layer 193 is preferably made of silver paste. The base 194 is a ceramic insulated disk with two holes 197 through which leading wires 196 extend for connecting the metal circuit layer 193 to a power source.

Figure 19:
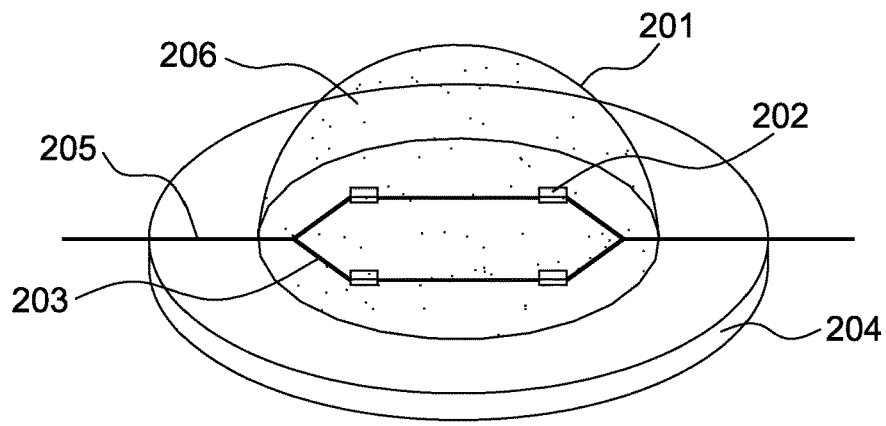
FIG. 19 is a schematic diagram of a LED lighting device in accordance with the tenth embodiment of the present disclosure.
Figure 20:
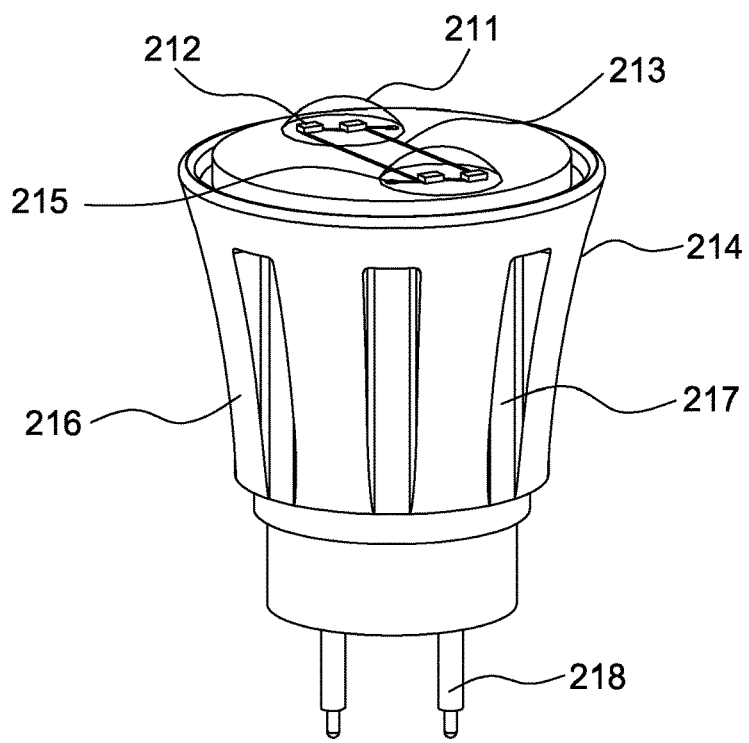
FIG. 20 is a schematic diagram of a LED lighting device in accordance with the eleventh embodiment of the present disclosure.
Figure 21:
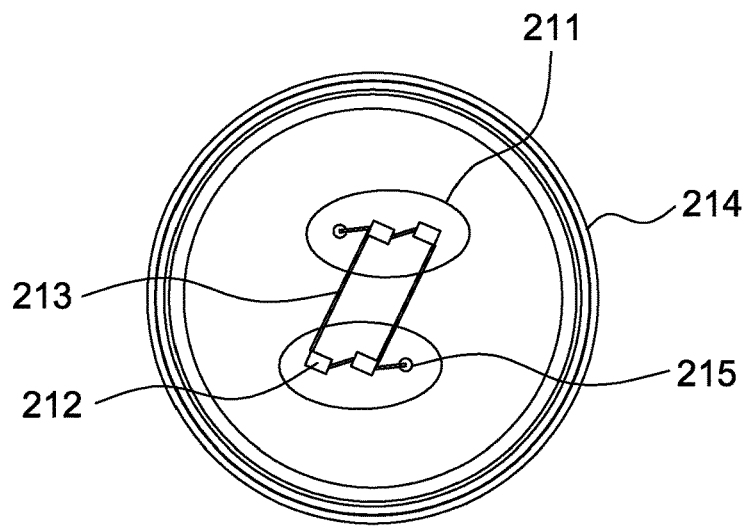
FIG. 21 is a top perspective view of the LED lighting device in FIG. 20.

Referring to FIG. 19, it shows an LED lighting device according to the tenth embodiment of the disclosure. The LED lighting device comprises four light emitting chips 202 arranged in a 2×2 matrix on the base 204, wherein two light emitting chips 202 are red and the other two light emitting chips 202 are blue. The four light emitting chips 202 and a portion of the base 204 are covered by an optical lens 201. A metal circuit layer 203 is coated on the surface of base 204 for electrically connecting the light emitting chips 202 to the leading wires 205 which pass through the slots between the optical lens 201 and the base 204 for being connected to a power source. The base 204 is a ceramic insulated plate and the heat produced by light emitting chips 202 is transferred through the metal circuit layer 203 and the ceramic base 204 to the surrounding environment. A phosphor 206 is filled within the optical lens 201 to change light spectrum of the light emitting chips 202.

Figure 22:
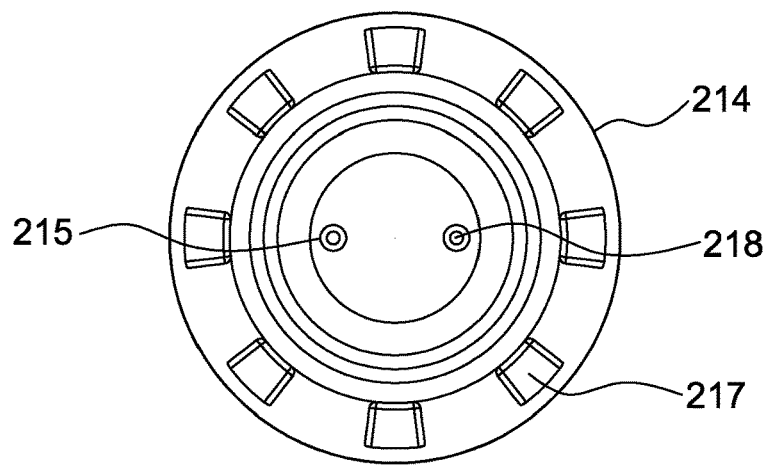
FIG. 22 is a bottom perspective view of the LED lighting device in FIG. 20.
Figure 23:
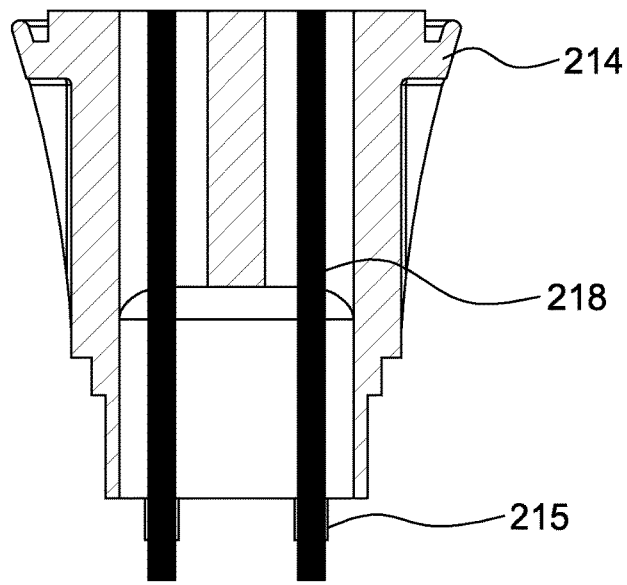
FIG. 23 is a longitudinal sectional view of the LED lighting device shown in FIG. 20.

Referring to FIGS. 20, 21 22 and 23, an LED lighting device according to the eleventh embodiment of the disclosure comprises a plurality of light emitting chips 212 disposed on the upper surface of a base 214. The base 214 has a shape flared upwardly from a lower portion of the base 214 to the upper surface of the base 214. The shape of the base 214 is also referred to as a trumpet shape. For example, the LED lighting device comprises four light emitting chips 212 of the same color arranged in a 2×2 matrix on the base 214. Two of the four light emitting chips 212 are covered by an optical shield 211 and the other two light emitting chips 212 are covered by another optical shield 211. A metal thermally conductive layer 213 is coated on the surface of base 214 for electrically connecting the light emitting chips 212 to the base 214. The base 214 is a ceramic insulated body provided with auxiliary heat dissipation structure with heat dissipation fins 216 and grooves 217 to enhance the heat dissipation effect. As shown in FIGS. 22 and 23, there are two through-holes 215 disposed in the base 214 and two pins 218 extend through these through-holes 215 to be connected to a power source.

Figure 24:
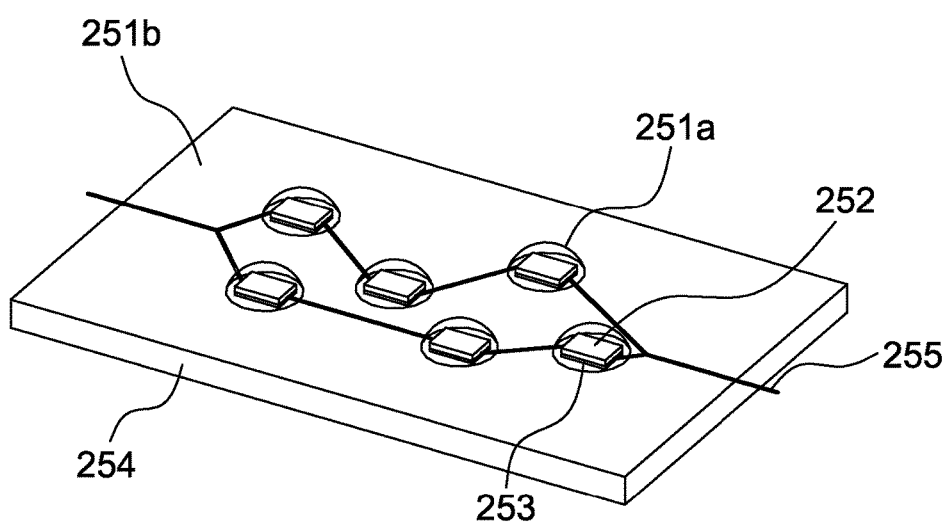
FIG. 24 is a schematic diagram of a LED lighting device in accordance with the twelfth embodiment of the present disclosure.

Referring to FIG. 24, it shows an LED lighting device according to the twelfth embodiment of the disclosure. Specifically, the LED lighting device comprises six light emitting chips 252 disposed on the base 254 either in a 2×3 matrix or in an irregular pattern. Each individual light emitting chip 252 is covered by an individual optical lens 251a. A thermally conductive layer 253 is coated on the surface of base 254 and the heat produced by light emitting chips 252 is transferred through the thermally conductive layer 253 and the ceramic base 254 to the surrounding environment. The thermally conductive layer 253 is preferably made of a thin diamond film. Leading wires 255 electrically connect the light emitting chips 252 to an outer power source. The entire base 254 and all light emitting chips 252 are covered by a layer of protective film 251b.

Figure 25:
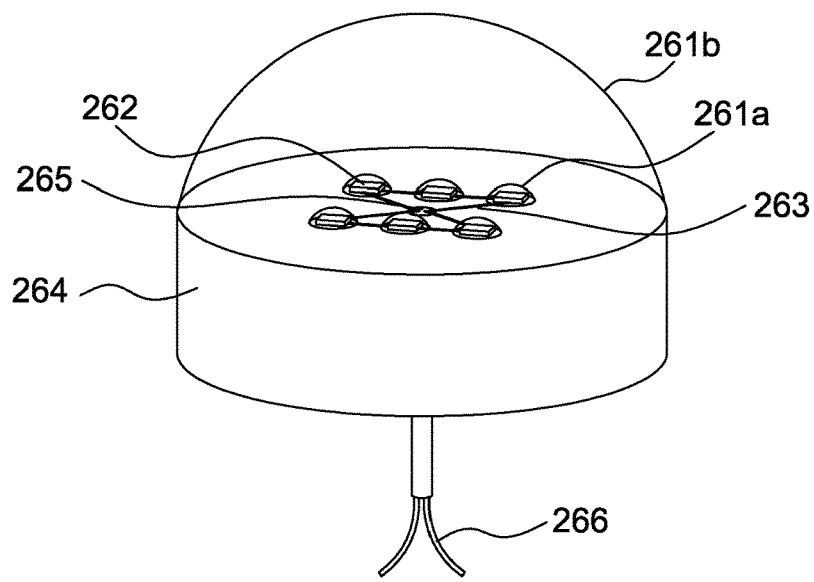
FIG. 25 is a schematic diagram of a LED lighting device in accordance with the thirteenth embodiment of the present disclosure.

Referring to FIG. 25, it shows an LED lighting device according to the thirteenth embodiment similar to the twelfth embodiment. Specifically, the LED lighting device comprises six light emitting chips 262 disposed on the base 264 in a 2×3 matrix, and each individual light emitting chip 262 is covered by an individual optical lens 261a. An optical shield 261b covers the entire upper surface of the base 264 for protecting the light emitting chips and the optical lens 261a. The base 264 is a ceramic insulated body with a through-hole 265 disposed in its center portion and a metal circuit layer 263 is patterned on the surface of base 264 for electrically connecting the light emitting chips 262 to the leading wires 266 which pass through the through-hole 265 for being connected to a power source.

Figure 26:
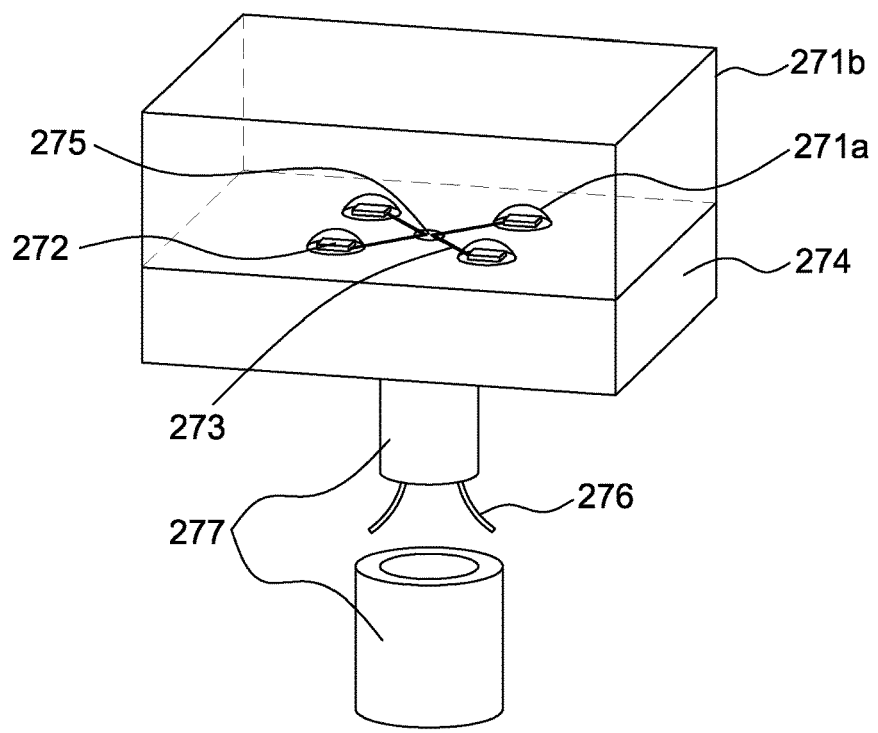
FIG. 26 is a schematic diagram of a LED lighting device in accordance with the fourteenth embodiment of the present disclosure.

Referring to FIG. 26 it shows an LED lighting device according to the fourteenth embodiment of the disclosure. Specifically, the LED lighting device comprises four light emitting chips 272 having same color and arranged in a 2×2 matrix on the base 274. Every light emitting chip 272 is individually covered by a packaging adhesive 271a. A bigger optical shield 271b completely covers the whole base 274 and all four light emitting chips 272. A thin layer of metal circuit 273 is coated on the surface of base 274 for electrically connecting the four light emitting chips 272 together and further connecting to the external leading wires 276. The base 274 is an insulated plastic cuboid having a through-hole 275 in the center. The leading wires 276 extend through the through-hole 275 to form two strands with Insulated paint coating on each surface of the strand. Both strands of the external leading wires 264 are separately connected to an anode and a cathode. The base 274 is provided with a fitting sleeve 277 on the bottom side and the external leading wires 276 extend inside. An LED driving device is disposed inside the fitting sleeve 277 and electrically connected with the external leading wires 276.

Figure 27:
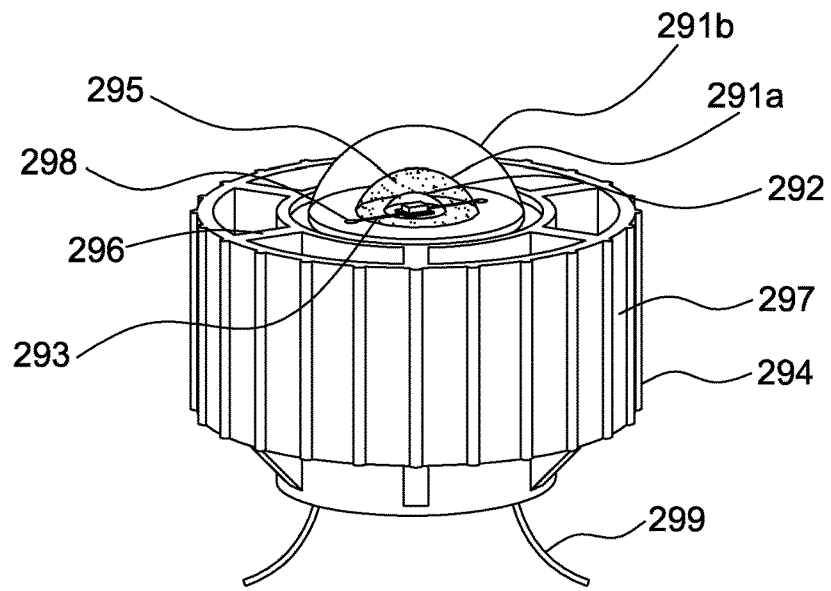
FIG. 27 is a schematic diagram of a LED lighting device in accordance with the fifteenth embodiment of the present disclosure.

Referring to FIG. 27, it shows an LED lighting device according to the fifteenth embodiment of the disclosure. The LED lighting device comprises a lighting component 292 packaged in a packaging adhesive. The entire lighting component 292 is covered by an optical shield 291a which is filled with a phosphor 295 to change spectrum of the lighting component 292. A bigger optical shield 291b covers the optical shield 291a for waterproof and dustproof. The lighting component 292 is coupled on the surface of the base 294 by a thin layer of metal circuit 293 which is preferably made of thermally conductive silver paste. Heat generated from the chip in the lighting component 292 is dissipated to the base 294 through the metal circuit 293 then further to the surrounding environment. The base 294 is a ceramic insulated hollow member with two through-holes 298 and with auxiliary heat dissipation structures which include a plurality of heat dissipation ribs 296 radially extending outwardly from the base 294 and a ring structure with heat dissipation grooves 297 surrounding the heat dissipation ribs 296.

Figure 28:
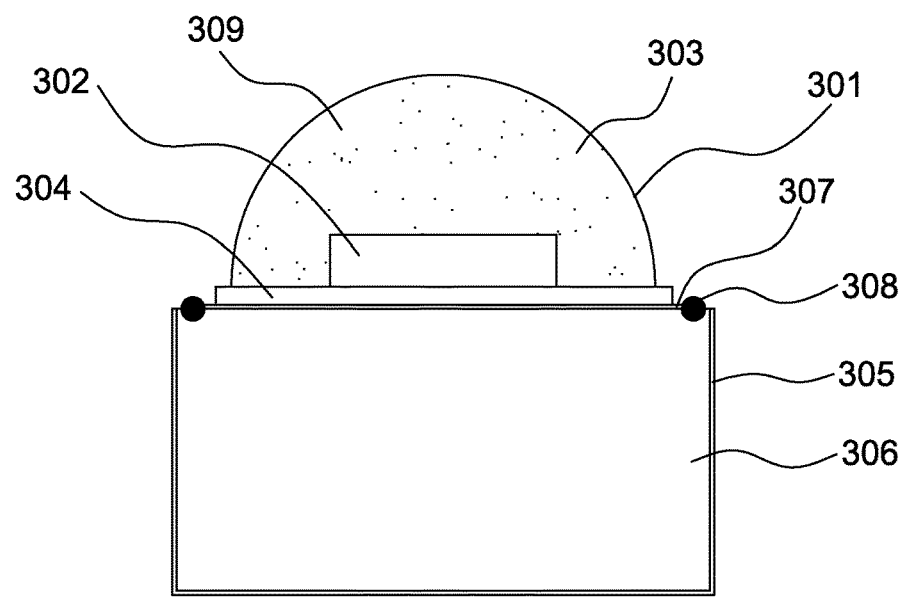
FIG. 28 is a schematic diagram of a LED lighting device in accordance with the sixteenth embodiment of the present disclosure.

Referring to FIG. 28, it shows an LED lighting device according to the sixteenth embodiment of the disclosure. Specifically, the LED lighting device comprises a lighting component 301 having a light emitting chip 302, a packaging optical shield 303 and a light bracket 304. A thin layer of thermally conductive material 305 but electrical insulated is coated on the top surface of the base 306 for coupling the light emitting chip 302 to the base 306. Preferably, the thermally conductive material 305 is an insulating paint which is coated on the entire outer surface of the base 306. A metal circuit layer 307 electrically connects the lighting component 301 to the two bonding pads 308 disposed on the base 306. The base 306 is a lighting cylinder coated by the insulate paint 305. A phosphor 309 is filled into the optical shield 303 to change spectrum of the lighting component 301.

Figure 29:
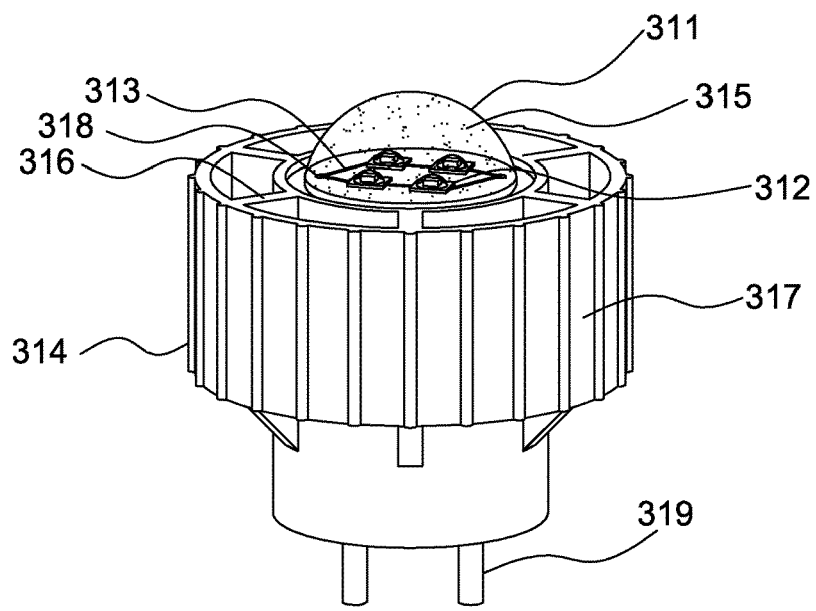
FIG. 29 is a schematic diagram of a LED lighting device in accordance with the seventeenth embodiment of the present disclosure.

Referring to FIG. 29, it shows an LED lighting device according to the seventeenth embodiment of the disclosure. Specifically, the LED lighting device comprises four lighting components 312 having same color arranged in 2×2 matrix pattern on the base 314. All four lighting components 312 are covered by an optical shield 311 for waterproof and dustproof and the optical shield 311 is filled with a phosphor 315 to change spectrum the lighting component 312. A thin layer of metal circuit 313 is coated on the surface of the base 314 to electrically connect the four lighting components 312 together. The base 314 is a ceramic insulated hollow member with auxiliary heat dissipation structures which include a plurality of heat dissipation ribs 316 radially extending outwardly from the base 314 and a ring structure with heat dissipation grooves 317 surrounding the heat dissipation ribs 316.

Figure 30:
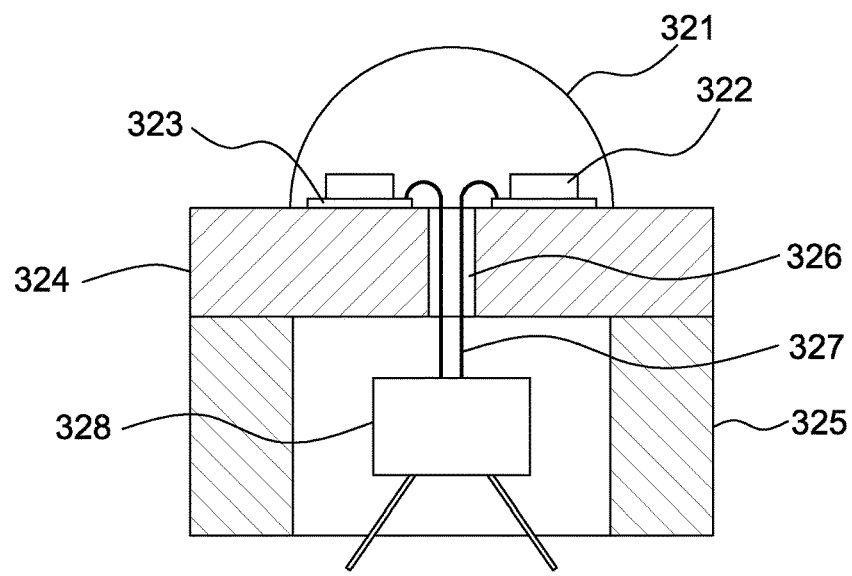
FIG. 30 is a schematic diagram of a LED lighting device in accordance with the eighteenth embodiment of the present disclosure.

Referring to FIG. 30, it shows an LED lighting device according to the eighteenth embodiment of the disclosure. The LED lighting device comprises two light emitting chips 322 covered by an optical lens 321 for waterproof and dustproof. A thin layer of metal circuit 323 coated on the surface of the base 324 for electrically connecting the two light emitting chips 322 together is preferably made of thermal silver paste. The base 324 is a ceramic insulated member and an auxiliary lighting heat dissipation structure 325 is mounted on the backside of the base 324. The base 324 have a through-hole 326 therein and the leading wires 327 pass through the through-hole 326 for being connected to an LED driving device 328 disposed within the auxiliary lighting heat dissipation structure 325.

Figure 31:
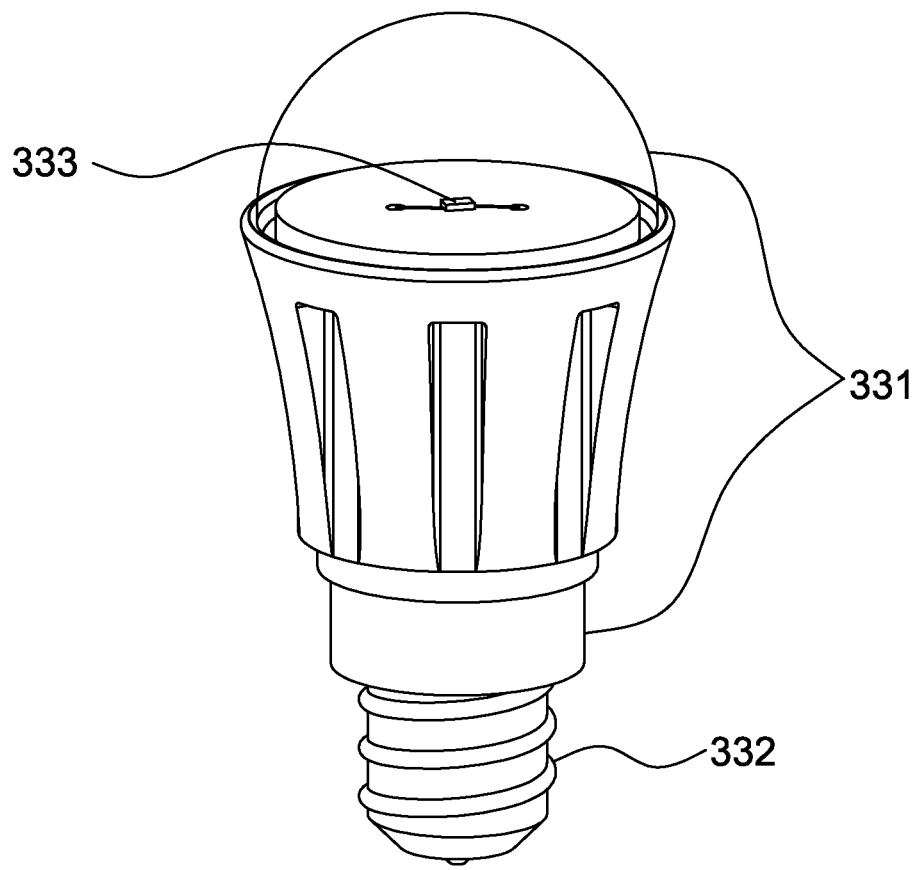
FIG. 31 is a schematic diagram of an LED luminaire in accordance with the nineteenth embodiment made of a LED lighting device protected in the present disclosure.

Referring to FIG. 31, it shows an LED bulb according to the nineteenth embodiment of the disclosure. Specifically, an LED bulb comprises an LED component 331 and an E-type connector 332. The LED component 331 includes an optical shield, a light emitting chip 333, thermal coupling material, and a base. The thermal coupling material is a thin diamond film disposed on the top surface of the base, and the base is a lighting member coated by the diamond film. A film of metal layer is coated on the surface of diamond film for circuit connection. Auxiliary heat dissipation structures are mounted on the base. An LED driving device is disposed inside the base. An E-type connector 332 is mounted on the base to form the LED bulb.

Figure 32:
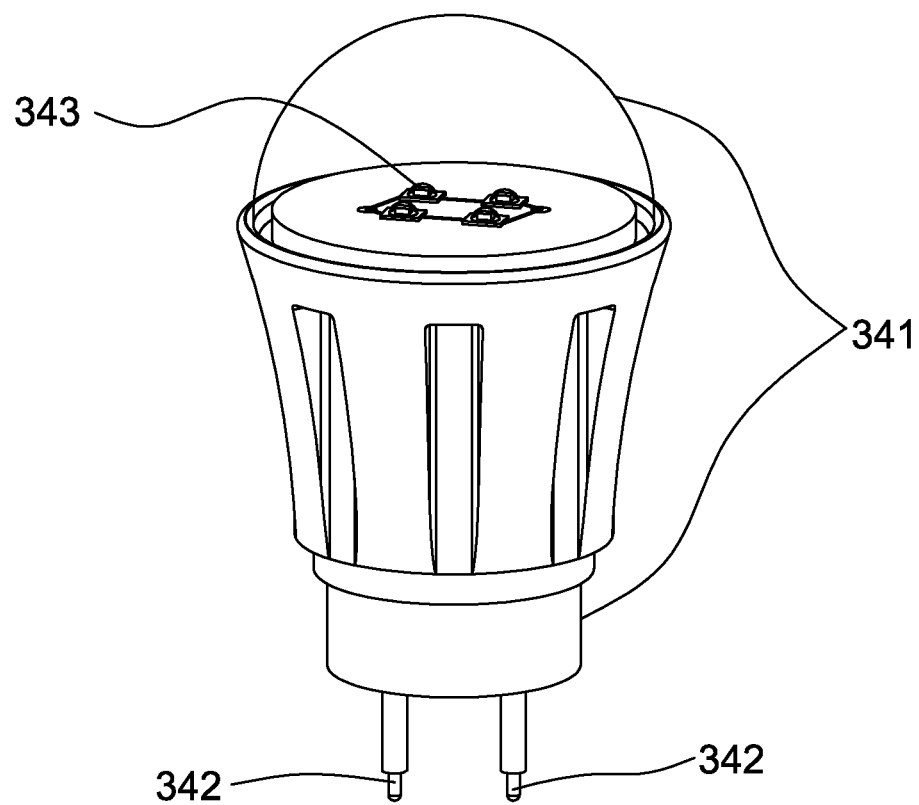
FIG. 32 is a schematic diagram of another LED luminaire in accordance with the twentieth embodiment made of an LED lighting device protected in the present disclosure.

Referring to FIG. 32, it shows an LED bulb according to the twentieth embodiment of the disclosure. Specifically, an LED bulb comprises an LED component 341 and a MR-type connector 342. The LED component 341 includes an optical, four light emitting chips 343, thermal coupling material, and a base. The four light emitting chips 343 comprise different color chips and are arranged in a 2×2 matrix on the base. The thermal coupling material is a layer of thermal silver paste coated on the top surface of the base for electrically connecting the four light emitting chips 343. The base is a ceramic member having cavity inside for accommodating an LED driving device. A MR-type connector 342 is mounted on the base to form the LED bulb.

Figure 33:
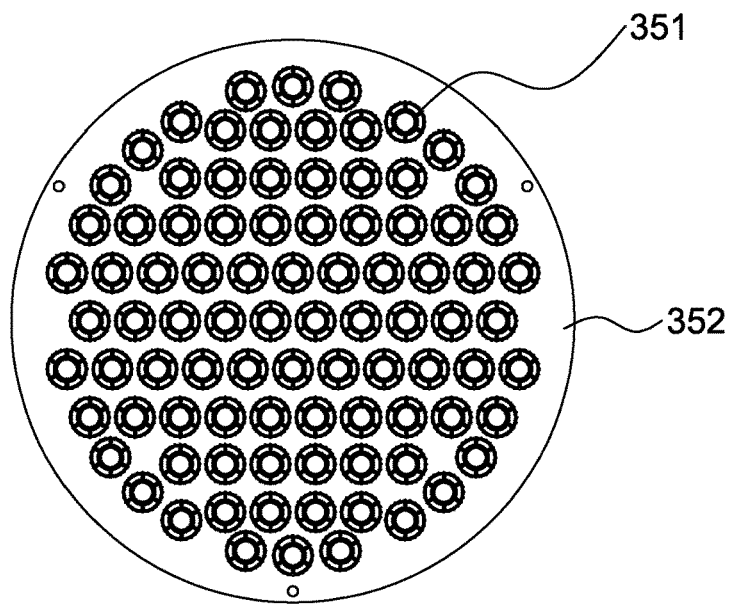
FIG. 33 is a schematic diagram of an LED luminaire in accordance with the twenty first embodiment made of an array of LED lighting device protected in the present disclosure.
Figure 34:
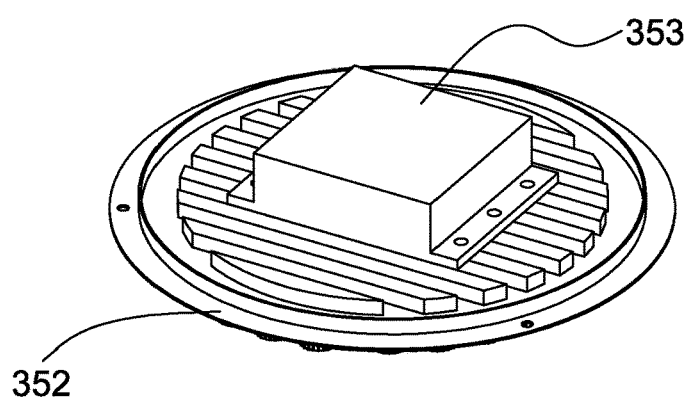
FIG. 34 is a rear view of the LED luminaire of FIG. 33.

Referring to FIGS. 33 and 34, it shows an LED luminaire according to the twenty first embodiment of the disclosure. Specifically, the LED luminaire comprises a plurality of LED components 351 disposed on a luminaire frame 352. The LED components 351 can be welded, adhered, or plugged to the luminaire frame 352. The LED components 351 can be fixed in the frame 352 permanently or detachably. The frame 352 is a honeycombed member with an LED driving device 353 provided at the bottom side thereof for fixing the LED components 351 and electrically connecting LED components 351 to the LED driving device 353. The LED driving device 353 is attached to the frame 352 via permanent connection (such as, welding connection) or detachable connection (such as, screw fixation).

Figure 35:
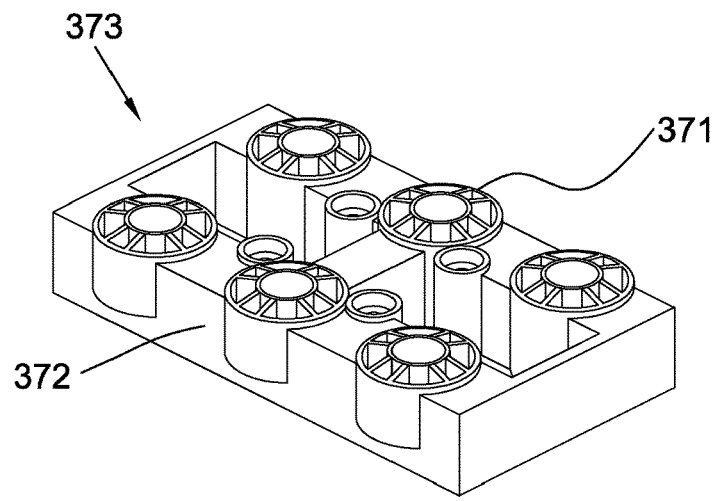
FIG. 35 is a schematic diagram of a LED source module in accordance with the twenty second embodiment made of a LED lighting device protected in the present disclosure.

Referring to FIG. 35, it shows an LED luminaire 373 according to the twenty second embodiment of the disclosure. Specifically, the LED luminaire comprises a plurality of LED components 371 disposed in a matrix pattern on a rectangular frame 372 to form an LED luminaire module. The rectangular frame 372 is preferably made of ceramic with a plurality of cavities for accommodating the LED components 371. The LED components 371 can be welded, adhered, or plugged to the frame 372 permanently or detachably. The LED components can be arranged in any way to form the LED luminaire, not limited to the 2×3 matrix configuration shown in FIG. 35.

Figure 36:
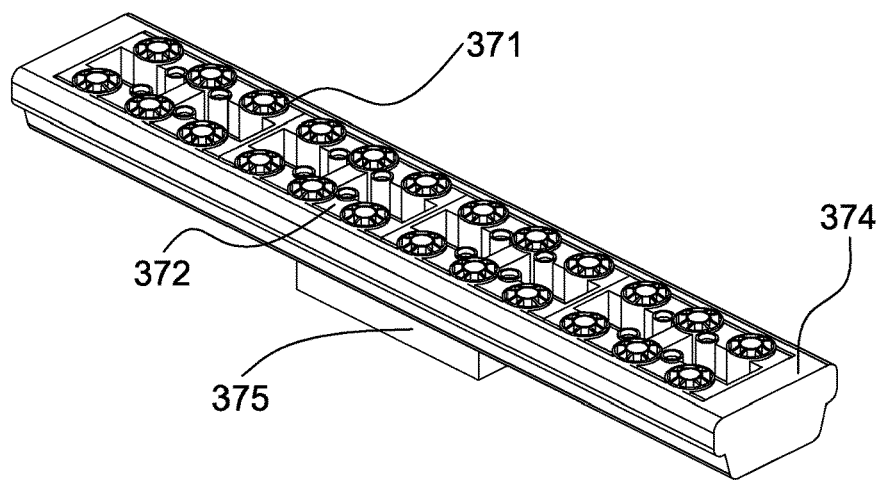
FIG. 36 is a schematic diagram of a LED luminaire in accordance with the twenty third embodiment made of the LED source module shown in FIG. 35.

Referring to FIG. 36, it shows an LED luminaire according to the twenty third embodiment of the twenty second embodiment. Specifically, a plurality of LED luminaire module of the twenty second embodiment is assembled within a luminaire shell 374. The luminaire shell 374 is provided with an LED driving device 375 for providing power to and driving the circuit of LED components 371. Not limited to the configuration shown in FIG. 36, the LED luminaire module can be configured in other ways, for example, 2×3 matrix, 3×3 matrix.

According to the present disclosure, there is no need to dispose a circuit board between the light emitting chip and the base in order to provide the light emitting chip with electricity in comparison with conventional luminous devices. This may reduce thermal resistance, and therefore enhance heat dissipation significantly.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A lighting device, comprising:
   a base;
   at least one light emitting chip having an anode pin and a cathode pin;
   at least one optical member covering the light emitting chip; and
   a thermally conductive adhesive layer having opposite sides directly contacting the light emitting chip and the base, respectively;
   wherein the thermally conductive adhesive layer includes electrical wires, and the anode pin and the cathode pin of the light emitting chip are directly mounted on and electrically bonded with the electrical wires of the thermally conductive adhesive layer,
   wherein the base includes an auxiliary heat dissipation structure comprising:
      a plurality of heat dissipation ribs radially extending outwardly from the base, and
      a ring structure with heat dissipation grooves surrounding the heat dissipation ribs, and
   wherein the base has a shape that is flared upwardly from a lower portion of the base toward an upper surface of the base, at least two through-holes are disposed in the base, and at least two pins extend through the at least two through-holes to be connected to a power source.

2. The lighting device according to claim 1, wherein the optical member is configured to change the light spectrum of light emitted by the light emitting chip.

3. The lighting device according to claim 2, wherein the optical member comprises a phosphor.

4. The lighting device according to claim 1, wherein the optical member comprises an optical lens.

5. The lighting device according to claim 1, wherein the optical member comprises a packaging adhesive.

6. The lighting device according to claim 1, wherein the base is electrically insulated.

7. The lighting device according to claim 6, wherein the base comprises a ceramic material.

8. The lighting device according to claim 6, wherein the thermally conductive adhesive layer comprises a circuit layer.

9. The lighting device according to claim 8, wherein the circuit layer comprises conductive silver paste.

10. The lighting device according to claim 8, wherein the circuit layer comprises a metal selected from the group consisting of molybdenum, manganese, wolframium, argentum, aurum, platinum, silver palladium alloy, cuprum, aluminum and stannum.

11. The lighting device according to claim 1, wherein the base is electrically conductive.

12. The lighting device according to claim 11, wherein the thermally conductive adhesive layer comprises an electrically insulated coating on the base.

13. The lighting device according to claim 12, wherein the insulated thermally conductive adhesive layer comprises a diamond film, an insulating varnish or a ceramic layer.

14. The lighting device according to claim 1, wherein the light emitting chip comprises an LED chip.

15. The lighting device according to claim 1, wherein
   the at least one light emitting chip comprises a plurality of light emitting chips disposed on the thermally conductive adhesive layer;
   the at least one optical member comprises a plurality of optical members each respectively covering at least one of the light emitting chips; and
   the lighting device further comprises a common optical shield enclosing the light emitting chips and the optical members on the upper surface of the base.

16. The lighting device according to claim 15, wherein each the optical members respectively covers at least two of the light emitting chips.

17. An LED luminaire, comprising:
a plurality of LED components, each LED component including:
a base;
a thermally conductive adhesive layer coated on a top surface of the base;
an LED chip disposed on the thermally conductive adhesive layer; and
an optical member covering the LED chip; and
a frame defining a plurality of cavities for accommodating the corresponding LED components;
wherein the thermally conductive adhesive layer includes electrical wires and an anode pin and a cathode pin of the LED chip are directly mounted on and electrically bonded with the electrical wires of the thermally conductive adhesive layer,
wherein the base includes an auxiliary heat dissipation structure comprising:
a plurality of heat dissipation ribs radially extending outwardly from the base, and
a ring structure with heat dissipation grooves surrounding the heat dissipation ribs, and
wherein the base has a shape that is flared upwardly from a lower portion of the base toward the top surface of the base, at least two through-holes are disposed in the base, and at least two pins extend through the at least two through-holes to be connected to a power source.

18. A lighting device, comprising:
a base;
a thermally conductive adhesive layer coated on a top surface of the base;
a light emitting chip disposed on the thermally conductive adhesive layer; and
an optical member covering the light emitting chip;
wherein the thermally conductive adhesive layer includes electrical wires and an anode pin and a cathode pin of the light emitting chip are directly mounted on and electrically bonded with the electrical wires of the thermally conductive adhesive layer,
wherein the lighting device is free of a circuit board between the base and the light emitting chip,
wherein the base includes an auxiliary heat dissipation structure comprising:
a plurality of heat dissipation ribs radially extending outwardly from the base, and
a ring structure with heat dissipation grooves surrounding the heat dissipation ribs, and
wherein the base has a shape that is flared upwardly from a lower portion of the base toward the top surface of the base, at least two through-holes are disposed in the base, and at least two pins extend through the at least two through-holes to be connected to a power source.

* * * * *